(12) United States Patent
Leduc (10) Patent No.: US 9,034,728 B2
(45) Date of Patent: May 19, 2015

(54) DIRECT BONDING PROCESS USING A COMPRESSIBLE POROUS LAYER

(71) Applicant: COMMISSARIAT A L'ENERGIE ATOMIQUE ET AUX ENE ALT, Paris (FR)

(72) Inventor: Patrick Leduc, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 242 days.

(21) Appl. No.: 13/784,001

(22) Filed: Mar. 4, 2013

(65) Prior Publication Data

US 2013/0252399 A1 Sep. 26, 2013

(30) Foreign Application Priority Data

Mar. 5, 2012 (FR) ...................... 12 51988

(51) Int. Cl.
*H01L 21/02* (2006.01)
*H01L 21/18* (2006.01)
*H01L 23/29* (2006.01)
*H01L 23/00* (2006.01)

(52) U.S. Cl.
CPC .......... *H01L 21/0226* (2013.01); *H01L 21/187* (2013.01); *H01L 2224/8001* (2013.01); *H01L 2224/80007* (2013.01); *H01L 2224/80357* (2013.01); *H01L 2224/08147* (2013.01); *H01L 23/293* (2013.01); *H01L 24/05* (2013.01); *H01L 24/80* (2013.01); *H01L 2224/05571* (2013.01); *H01L 2224/05647* (2013.01); *H01L 2224/05655* (2013.01); *H01L 2224/80201* (2013.01); *H01L 2224/80895* (2013.01); *H01L 2224/80896* (2013.01); *H01L 2221/1047* (2013.01); *H01L 2924/00014* (2013.01)

(58) Field of Classification Search
CPC ..................................................... H01L 21/187
See application file for complete search history.

(56) References Cited

U.S. PATENT DOCUMENTS

| 5,277,748 | A | 1/1994 | Sakaguchi et al. |
| 6,190,937 | B1 | 2/2001 | Nakagawa et al. |
| 8,039,921 | B2 * | 10/2011 | Ito et al. .................. 257/499 |

(Continued)

FOREIGN PATENT DOCUMENTS

| EP | 0 553 774 A1 | 8/1993 |
| EP | 0 554 795 A1 | 8/1993 |

(Continued)

OTHER PUBLICATIONS

French Preliminary Search Report issued Dec. 17, 2012 in Patent Application No. 1251988 with English translation of categories of cited documents.

(Continued)

*Primary Examiner* — Seahvosh Nikmanesh
(74) *Attorney, Agent, or Firm* — Oblon, McClelland, Maier & Neustadt, L.L.P.

(57) ABSTRACT

A method for direct bonding between a first element and a second element, including at least the following steps:
  deposition of at least one first porous layer on at least one face of the first element, where the first porous layer is compressible,
  production of at least one bonding layer on the first porous layer,
  rigid connection by direct bonding of the second element with the first bonding layer.

24 Claims, 4 Drawing Sheets

(56) References Cited

U.S. PATENT DOCUMENTS

| | | | |
|---|---|---|---|
| 8,790,785 B2 * | 7/2014 | Yamamoto et al. | ............ 428/447 |
| 2010/0040893 A1 | 2/2010 | Yagihashi et al. | |

FOREIGN PATENT DOCUMENTS

| | | |
|---|---|---|
| EP | 0 851 513 A2 | 7/1998 |
| EP | 0 851 513 A3 | 7/1998 |
| EP | 2 154 710 A2 | 2/2010 |

OTHER PUBLICATIONS

Y. Bertholet, et al., "Molecular bonding aided by dissipative interlayers", Acta Materialia, vol. 55, Issue 2, Jan. 2007, pp. 473-479.

Qin-Yi Tong, et al., "Wafer Bonding and Layer Splitting for Microsystems", Advanced Materials, vol. 11, No. 17, 1999, pp. 1409-1425.

Rachid Taibi, et al., "Full Characterization of Cu/Cu Direct Bonding for 3D Integration", ECTC, Conference 2010, 2010, pp. 219-225.

Guohua Wei, et al., "A Comprehensive Study on Nanomechanical Properties of Various $SiO_2$-based Dielectric Films", Micron Technology, Inc., 2010 IEEE, 2010, 4 pages.

Kris Vanstreels, et al., "Nanoindentation study of thin plasma enhanced chemical vapor deposition SiCOH low-k films modified in He/$H_2$ downstream plasma", J. Vac. Sci. Technol. B 28 (1), Jan./Feb. 2010, pp. 173-179.

Cyclotene 4000 Series, Advanced Electronic Resins (Photo BCB)—Processing Procedures for Cyclotene 4000 Series Photo BCB Resins, 2005, pp. 1-9.

HD MicroSystems™ Product Selection Guide, HD MicroSystems™, Aug. 2009, 2 pages.

* cited by examiner

DIRECT BONDING PROCESS USING A COMPRESSIBLE POROUS LAYER

TECHNICAL FIELD

The invention relates to a method for direct bonding between two elements, including the production of a compressible porous layer to reduce the size of the defects produced at the bonding interface between the two elements. Such a method is advantageously implemented to perform direct bonding between two substrates, or between two electronic chips (or circuits), or again between a substrate and an electronic chip.

STATE OF THE PRIOR ART

Direct bonding between two elements consists in placing two surfaces of these elements in direct contact, without using a specific bonding material (adhesive, wax, a metal with a low melting point to form a weld, etc.) between these two surfaces. Such bonding requires that both the surfaces to be bonded are sufficiently smooth, and free of particles or contamination (particularly by hydrocarbons), and that they are sufficiently close to one another to enable a contact to be initiated, typically at a distance of less than a few nanometers. In this case, the attractive forces between the two surfaces become sufficiently high to cause molecular bonding between the surfaces.

Direct bonding is initially induced through all the attractive forces (Van der Waals forces) of electronic interaction between atoms or molecules of the two surfaces to be bonded. The smaller the distance between the atoms or molecules of the two surfaces the greater these attractive forces. In addition, they depend on the nature of the surfaces and on the medium separating them. With most direct bonds, two families of surfaces are thus considered: surfaces having a hydrophilic character, and those having a hydrophobic character. The main difference between these two types of surface is the presence of water films (corresponding to a few molecular monolayers) adsorbed by the hydrophilic surfaces.

In many applications bonds are made at ambient temperature and pressure, after the surfaces to be bonded have been subjected to chemical cleaning. The bonding energy obtained may be improved through implementation of a thermal treatment. The higher the temperature applied in this thermal treatment the higher the bonding energy obtained. Above a certain temperature, which depends in particular on the cleaning performed before the (hydrophilic or hydrophobic) surfaces are bonded, most of the bonds between the two surfaces become covalent bonds.

Such direct bonding may be accomplished between two semiconducting substrates. Direct bonding may also be accomplished between two electronic chips, each of which has metal bonding pads, where the chips are bonded to one another such that the metal bonding pads of the chips which are positioned facing one another are connected together electrically, forming electrical interconnections between the two chips (the case of an integration known as "3-D" integration of the chips). In this case, the seal made is a mixed bond of metal (copper, nickel, etc.) of the bonding pads and of dielectric, for example silicon oxide, between the bonding pads.

One difficulty relating to the production of such a direct bond lies principally in the preparation of the surfaces to be bonded, which is undertaken in order to remove as many particles and contaminants as possible present on these surfaces. A particle of several hundred nanometers of diameter present on one of the surfaces to be bonded may indeed produce, in the bonding interface, a defect (which corresponds to a unbonded area between the surfaces, around the particle) of several mm$^2$. For this reason, as many particles as possible must be removed during the preparation of the surfaces before bonding. Chemical mechanical polishing (CMP) followed by scrubbing and chemical cleaning are generally used to remove the particles present on the surfaces to be bonded.

However, in the case of certain applications, such as 3-D integration of electronic chips, this cleaning constraint makes use of direct bonding difficult. For example, in the case of direct bonding between a chip and a substrate, each of which includes copper contacts intended to be bonded directly to one another, removal of the particles may be made difficult either through the presence of surface topographies (due to the contacts), or through the presence of heterogeneous materials on the surfaces, or again by the way in which the surface preparation of the chips is managed. In addition, it is never possible to obtain surfaces which are completely clean and free of particles.

The document of Y. Bertholet et al., "Molecular bonding aided by dissipative inter-layers", Acta Materiala, Volume 55, Issue 2, January 2007, pages 473-479, describes the possibility of inserting a fine, plastically deformable layer consisting of aluminium between a substrate and an SiO$_2$ bonding layer in the course of a direct bonding with another substrate which also includes a fine, plastically deformable layer consisting of aluminium inserted between this other substrate and another SiO$_2$ bonding layer.

The presence of these aluminium layers enables the resistance of the produced assembly in terms of crack creation and propagation in the bonding interface to be increased, and therefore enables bonding in the bonding interface to be improved. This improvement of bonding is related to the relaxation, or dissipation, of the mechanical energy in the deformable layers, in the vicinity of the cracks, due to the plastic deformation of these layers. In this document the thickness of the plastically deformable aluminium layers is equal to 1 μm.

However, such plastically deformable layers do not enable an effective response to be given to the problem relating to the presence of particles at the bonding interface, due to the fact that in the presence of such particles in the bonding interface these layers become locally deformed only to a very limited extent, and the material plastically deformed by the particle is moreover moved to its periphery.

DESCRIPTION OF THE INVENTION

There is therefore a need to provide a method for direct bonding between two elements allowing a reduction of the size of the defects caused by the presence of particles on the surfaces of the elements which are intended to be rigidly connected to one another.

To accomplish this, one embodiment proposes a method for direct bonding between a first element and a second element, including at least the following steps:
  production of at least one first porous layer on at least one face of the first element, where the first porous layer is compressible,
  production of at least one first bonding layer on the first porous layer,
  rigid connection by direct bonding of the second element with the first bonding layer.

A layer of material is said to be "compressible" if its volume is reduced under the effect of a pressure stress compared to its initial volume, i.e. relative to its volume when the layer is not subject to a pressure stress. This compressibility of the porous layer is obtained through the presence of pores in the layer, and through the intrinsic elasticity and/or plasticity properties of the material of the porous layer. This compressible character of the porous layer thus enables the volume of the layer to be reduced when a mechanical pressure is present, namely the pressure produced by one or more particles present at the bonding interface in the course of the direct bonding between the two elements.

Thus, by using a porous and compressible layer, when one or more particles is inserted directly or indirectly in the porous layer (where the deformations caused by the particles are transmitted into the porous layer), the material of the porous layer is locally deformed by densification of its structure, and the material does not move towards the exterior of the area indented by each particle.

The direct bonding method therefore proposes to insert a porous layer in the upper portion of the first element, under the surface intended to be assembled by direct bonding to the second element. Bearing in mind the presence of the pores, or pore spaces, in this layer and its mechanical properties, this layer is therefore compressible. This porous layer may be elastically compressible (i.e. elastically deformable) and/or plastically compressible (i.e. plastically deformable). A mechanical compression stress applied to the porous layer therefore causes its volume to be reduced and its structure to be densified. This porous layer enables all, or a proportion of, the deformations due to the presence of particles on the surfaces which are to be bonded to be absorbed when a rigid connection is made by direct bonding. In the case of a porous layer comprising an elastically compressible material, the compressible character of the porous layer is due to the combination of the elastic nature of the material used (a material the Young modulus of which may be less than or equal to approximately 20 GPa has, for example, a high elastic deformation capacity), and of the presence of pore spaces in this layer, the volume of which may be reduced locally in order to compensate for, or "absorb", the volume of the particles present at the bonding interface. In the case of a porous layer comprising a plastically compressible material, the compressible character of the porous layer is due to the combination of the deformable nature of the material used (which has, for example, a elastic limit of less than or equal to approximately 350 MPa) and of the presence of pore spaces in this layer.

The presence of such a porous layer makes direct bonding insensitive or only slightly sensitive to any particles which may be present on the surfaces to be bonded, allowing a very substantial reduction of the size of the bonding defects due to the presence of particles, i.e. the size of the unbonded areas around the particles. When the two surfaces to be rigidly connected are brought into contact, the porous layer is locally deformed in the vicinity of the particles, making it easier to bring the two surfaces to be bonded into contact and, consequently, reducing the size of the unbonded areas, i.e. of the defects.

The first porous layer may be produced by implementing a deposition step. The porous layer may thus be produced without any constraints with regard to the nature of the material on which the porous layer is deposited (the first element). The porous layer may thus be produced on an element which is, for example, not silicon. The porous layer may therefore include at least one material different from that of the first element. In addition, production of the porous layer by implementing deposition enables the porous layer to be formed without necessarily having a continuous conductive base for the production of the pore spaces. The porous layer may therefore be produced on an electrically insulating surface.

The compressible porous layer may have an isothermal compressibility coefficient $\chi_T$ greater than approximately $10^{-10}$ Pa$^{-1}$ at approximately 25° C.

The compressibility of a material corresponds to the reduction of volume of the material when it is subjected to an isostatic (or uniform) compression. It is generally defined in the elastic field, and is therefore reversible. However, this definition may be extended to the inelastic field. The isothermal compressibility coefficient $\chi_T$ of an isotropic material is defined according to the following equation:

$$\chi_T = -\frac{1}{V}\left(\frac{\delta V}{\delta P}\right)_T$$

where V is the volume of the material, P is the isostatic pressure, and T the temperature, which assumed to be constant.

Another parameter which may be used to characterise the compressible character of the layer is the isostatic elasticity modulus, also called bulk modulus (K). The bulk modulus K is the inverse of the isothermal compressibility coefficient $\chi_T$ and measures the resistance of a material to uniform compression. K is related directly to the Young modulus (E) and to the Poisson coefficient of the material (ν) by the following relationship:

$$K = \frac{1}{3}\frac{E}{(1-2\nu)}$$

An isothermal compressibility coefficient $\chi_T$ of $1.10^{-10}$ Pa$^{-1}$ is equal to a bulk modulus K of 10 GPa.

The Young modulus E of the material of the compressible porous layer may be less than or equal to 18 GPa. The Poisson coefficient ν of the material of the compressible porous layer may be less than or equal to 0.2.

The first porous layer may have a void volume ratio greater than or equal to approximately 10% and/or be composed of, or include, at least one elastically deformable material having a Young modulus of less than or equal to approximately 20 GPa, and/or at least one plastically deformable material having an elastic limit of less than or equal to approximately 350 MPa. The void volume ratio corresponds to the ratio between the volume occupied by the pores in the compressible porous layer and the total volume of the compressible porous layer.

According to one advantageous embodiment, the size of the pores of the first porous layer may be less than or equal to approximately one tenth the thickness of the porous layer, and/or be less than the size of the particles likely to be present at the bonding interface between the two elements when a rigid connection by direct bonding is made, i.e. of the particles able to produce bonding defects. The size of the particles which may be present at the bonding interface may be measured and/or calculated beforehand by bonding tests between the two elements which are to be rigidly connected.

The material of the first porous layer may advantageously be chosen such that the void volume ratio is greater than or equal to approximately 10% and/or such that the size of the pores is less than or equal to approximately 10 nm. The smaller the size of the pores, the easier it will be to incorporate the material of the first porous layer in the stack, and the easier it will be able to be structured by conventional etching techniques. Furthermore, the size of the pores may be less than the size of the particles present at the bonding interface. To achieve greater effectiveness, the thickness of the first porous layer may be greater than the size of these particles.

The first element and/or the second element may include a substrate or an electronic chip. The method is advantageously implemented to perform direct bonding between two substrates, or between two electronic chips, or again between a substrate and an electronic chip.

The method may also include the following steps:
production, on at least one face of the second element, of at least one second compressible porous layer,
production of at least one second bonding layer on the second porous layer,
and in which a rigid connection by direct bonding of the second element with the first bonding layer may be obtained by bringing the first bonding layer directly into contact with the second bonding layer.

As with the first porous layer, the second porous layer may be produced by implementing a deposition step. The same advantages as those described above for the first porous layer are then found when the second porous layer is produced by deposition.

The second porous layer may have a void volume ratio greater than or equal to approximately 10% and/or be composed of, or include, at least one elastically deformable material having a Young modulus of less than or equal to approximately 20 GPa, and/or at least one plastically deformable material having an elastic limit of less than or equal to approximately 350 MPa.

The size of the pores of the second porous layer may be less than or equal to approximately one tenth the thickness of the second porous layer, and/or may be less than the size of the particles likely to be present at the bonding interface between the two elements when a rigid connection by direct bonding is made.

The different properties set out above for the first porous layer may also apply to the second porous layer.

The thickness of the first porous layer may be greater than the thickness of the first bonding layer, and/or the thickness of the second porous layer may be greater than the thickness of the second bonding layer. By this means, the compressible character of the porous layer or layers is increased, in order to reduce optimally the defects produced by the particles present at the bonding interface. The thickness of the first bonding layer and/or the thickness of the second bonding layer may be less than approximately 50 nm.

Production of the first porous layer and/or production of the second porous layer may include at least implementation of a PECVD (Plasma Enhanced Chemical Vapour Deposition) of porous SiOCH. In this case, the first and/or the second porous layer may naturally have a porous character.

Production of the first porous layer and/or production of the second porous layer may include deposition of a material capable of being etched, and intended to form the first porous layer and/or the second porous layer, followed by formation of pores by chemical and/or electrochemical etching in the deposited material. Such a porous layer may thus be obtained, for example, by deposition of an aluminium layer made porous by electrochemical etching, for example through a nanoporous membrane. The pores may also be produced by local anode oxidation of the aluminium.

Production of the first porous layer and/or production of the second porous layer may include at least implementation of the following steps:
deposition of the material of the first porous layer and/or of the second porous layer, where pore-forming particles are added to the said deposited material, and
elimination of the said pore-forming particles, forming pores within the material of the first porous layer and/or of the second porous layer.

In this case, the material of the first porous layer and/or the material of the second porous layer may include SiOCH and/or BCB (benzocyclobutene) and/or polyimide. The material may be deposited by PECVD or by spin-on, depending on the chosen material.

Production of the first bonding layer and/or production of the second bonding layer may include a step of deposition of the material of the first bonding layer on the first porous layer and/or a step of deposition of the material of the second bonding layer on the second porous layer.

As a variant, production of the first bonding layer and/or production of the second bonding layer may include a step of thermal, plasma or chemical treatment of a portion of the first porous layer and/or of the second porous layer, where the said treated portion of the first porous layer forms the first bonding layer and/or the said treated portion of the second porous layer forms the second bonding layer.

The method may also include, between the step of production of the first bonding layer and the step of rigid connection by direct bonding of the second element with the first bonding layer, implementation of the following steps:
photolithography and etching of at least one bonding pad location through the first bonding layer, the first porous layer and a portion of the first element,
deposition, at least in the said location, of at least one electrically conductive material forming the bonding pad,
chemical mechanical planarisation, stopping at the first bonding layer,
and in which, when the second element is rigidly connected by direct bonding with the first bonding layer, the bonding pad produced in the first element may be rigidly connected by direct bonding with a bonding pad produced in the second element.

As a variant, the method may also include, before the step of production of the first porous layer, implementation of the following steps:
photolithography and etching, through a portion of the first element, of at least one bonding pad location,
deposition, at least in the said location, of at least one electrically conductive material forming the bonding pad,
in which production of the first porous layer may include implementation of the following steps:
deposition of the first porous layer on the first element and the bonding pad,
chemical mechanical planarisation of the first porous layer, stopping at the bonding pad,
and in which, when the second element is rigidly connected by direct bonding with the first bonding layer, the bonding pad produced in the first element is rigidly connected by direct bonding with a bonding pad produced in the second element.

The method may also include, prior to the deposition of the electrically conductive material in the said location, deposition of at least one layer of material capable of forming a barrier to diffusion of the material of the bonding pad, where the electrically conductive material may subsequently be deposited on this layer of barrier material.

According to one advantageous embodiment, the first element and/or the second element may include a layer of dielectric material, where the step of photolithography and etching may also be accomplished through this layer of dielectric material, and where the latter may be at least partly eliminated after the step of production of the bonding pad.

BRIEF DESCRIPTION OF THE ILLUSTRATIONS

The present invention will be better understood on reading the description of example embodiments given purely as an indication and in no sense restrictively, making reference to the appended illustrations in which.

Identical, similar or equivalent parts of the various figures described below have the same numerical references, to make it easier to move from one figure to another.

The various parts represented in the figures are not necessarily represented at a uniform scale, in order to make the figures more readable.

The various possibilities (variants and embodiments) must be understood as not being mutually exclusive, and being able to be combined with one another.

DETAILED ACCOUNT OF PARTICULAR EMBODIMENTS

Figure 1A:
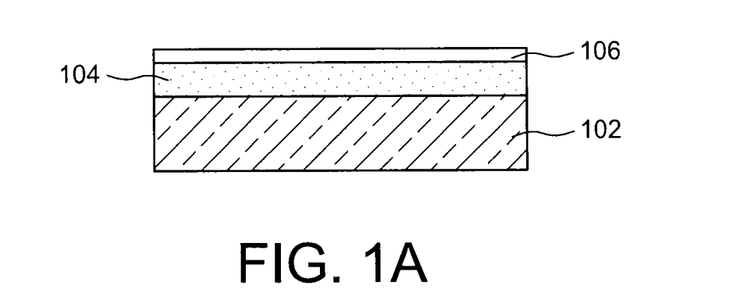
FIGS. 1A and 1B represents steps of a direct bonding method according to a first embodiment.
Figure 1B:
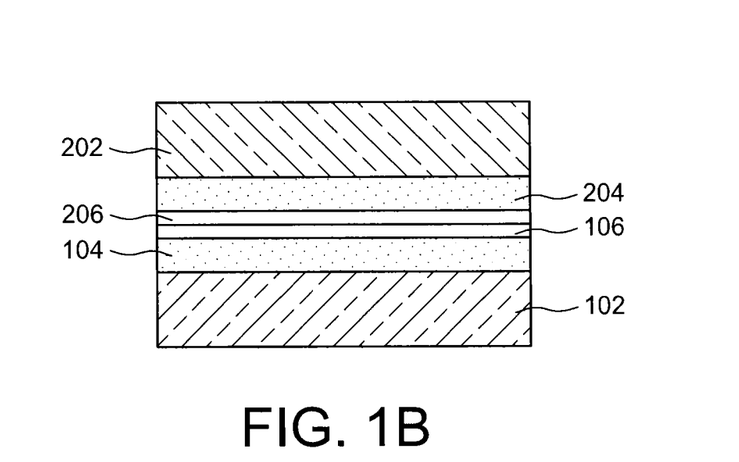

In connection with FIGS. 1A and 1B, the steps of a method for direct bonding between two elements, in this case two substrates, are described, according to a first embodiment.

As represented in FIG. 1A, a first substrate 102, or first wafer, for example comprising a semiconductor such as silicon, is prepared in order that it may be rigidly connected by direct bonding to a second substrate 202, for example also comprising silicon. For this purpose, a first porous layer 104 is produced on first substrate 102. The material of first porous layer 104 is produced such that it has a void ratio greater than or equal to approximately 10%, and such that it is compressible, i.e. such that its elasticity and/or plasticity properties allow the material to be compressed when subject to a mechanical pressure equivalent to that produced by particles which may be present at the bonding interface with second substrate 202. For this purpose, the Young modulus of the material used may be less than or equal to approximately 20 GPa and/or the elastic limit of the material may be less than or equal to approximately 350 MPa.

First porous layer 104 may comprise an organic material, for example BCB, the Young modulus of which is equal to approximately 2.9 GPa, and/or polyimide, the Young modulus of which is equal to approximately 3.3 GPa. First porous layer 104 may also comprise a mineral material doped with organic molecules such as porous SiOCH, the Young modulus of which is equal to approximately 5 GPa. First porous layer 104 may also comprise at least one metal the elastic limit of which is sufficiently low to be compressible. Such a metal may be deposited by CVD (Chemical Vapour Deposition), PVD (Physical Vapour Deposition) or by electrolytic means (ECD), and may be made porous by chemical and/or electrochemical etching. For example, first porous layer 104 may comprise aluminium made porous, for example, by anode oxidation.

Generally, the thickness of first porous layer 104 may be between approximately 100 nm and 5 μm.

The pore spaces present in the material of first porous layer 104 may be naturally present in the material used to form layer 104, or may be created when first porous layer 104 is produced, when the material used does not naturally have such pore spaces, or to increase the material's void ratio.

For example, first porous layer 104 may comprise SiOCH and may be deposited by PECVD or by spin-on. The pore spaces may be produced naturally by doping a matrix of the silsesquioxane type or of the silica type with carbon groups, for example methyl CH3. The pore spaces may also be produced by adding sacrificial nanoparticles called pore-forming nanoparticles. In the case of deposition by spin-on, pore-forming agents are added to the layer either by dispersing pore-forming nanoparticles in a precursor solution, or by grafting macromolecules to the precursor. The PECVD technique also enables pore spaces to be created by substitution, for example by using a biphasic precursor, for example a blend of Tetra Methyl Cyclo Tetra Siloxane (TMCTS) with a thermally unstable CHx phase. After releasing the pore-forming agent or the unstable phase by thermal or ultraviolet treatment, a porous material is obtained. Void ratios of over approximately 50% are possible. The size of the pores is generally of a few nanometers.

Organic materials of the BCB or polyimide type containing pore-forming particles may also be used. These pore-forming particles are, for example, organic materials such as hydrocarbons. The size of the particles may be between a few nanometers (less than 10 nm) and a few tens of nanometers (less than 100 nm). These particles are then eliminated, for example using a UV treatment or a thermal treatment, by this means releasing the spaces previously occupied by these particles, and forming the pores in first porous layer 104. Even when the material of first porous layer 104 naturally has pore spaces (case of porous SiOCH, for example), additional pore spaces may be produced in the deposited material, for example using pore-forming particles as previously described.

In order that it fully fulfils its purpose as a compressible layer, first porous layer 104 is produced such that it is thicker than the size of any particles which may be present on the surfaces to be bonded. To dimension first porous layer 104, prior tests may be undertaken to determine in advance the maximum size of the particles which may be present on the surfaces to be bonded (where this size depends, notably, on the materials used, the techniques implemented, the equipment used, etc.).

On first porous layer 104 a first bonding layer 106 is then produced, intended to be rigidly connected, in a subsequent direct bonding step, to second substrate 202.

First bonding layer 106 may be deposited, for example by PECVD (for example a silica deposition of between approximately 10 nm and 100 nm), on first porous layer 104, or may alternatively be created from an upper portion (a portion opposite the one in contact with first substrate 102) of first porous layer 104, for example by means of a thermal, plasma or chemical treatment, transforming this upper portion of first porous layer 104 into first bonding layer 106. For example, when first porous layer 104 comprises porous SiOCH, a dense layer of SiOC may be produced on the surface of first porous layer 104 (i.e. using only a small proportion of the thickness of first porous layer 104, on the side opposite the one in contact with first substrate 102), using a plasma treatment, where this layer of SiOC is first bonding layer 106. First bonding layer 106 is produced such that it is less thick than first porous layer 104, in order that, during the rigid connection by direct bonding, first porous layer 104 fulfils its purpose as a compressible layer optimally, reducing the impact of the particles present at the bonding interface. First bonding layer 106 is advantageously between approximately 1 nm and 100 nm thick, or less than approximately 50 nm thick.

Simultaneously with the production of first porous layer 104 and first bonding layer 106 on first substrate 102, a second porous layer 204, for example similar to first porous layer 104, and a second bonding layer 206, which may also be similar to first bonding layer 106, are produced on second substrate 202 intended to be rigidly connected to first substrate 102.

Bonding layers 106 and 206 are then bonded with direct bonding (FIG. 1B).

As with conventional direct bonding (without the presence of porous layers 104 and 204), a thermal treatment may be used to consolidate this bonding. During this direct bonding, if particles are present at the interface between bonding layers 106 and 206, porous layers 104 and 204 are then deformed locally in the areas of these particles, thereby greatly reducing the size of the unbonded areas in this interface. As with conventional direct bonding, chemical mechanical polishing may be used to reduce the surface roughness, and to activate the bonding surface. In this case the thickness of either or both of the bonding layers (106 and/or 206) must take into account the consumption of one or both of the layers during polishing. By adjusting the method time, polishing may also be used to adjust the thickness of one or both of the bonding layers before the step of bonding, so as to optimise the effect of the compressive layers.

The direct bonding method described above in connection with FIGS. 1A and 1B may also apply for direct bonding of two electronic chips to one another (where the chips are previously described elements 102 and 202), or again for direct bonding of an electronic chip and of a substrate.

In addition, a single one of two porous layers 104 and 204 may be produced. For example, if only first porous layer 104 is produced, second element 202 may be rigidly connected, directly or via a bonding layer, with first bonding layer 106.

Digital finite element simulations show that the size of an unbonded area around a particle is reduced by half by inserting a porous layer the thickness of which is roughly equal to the radius of the particle, the material of which has a Young modulus of approximately 5 GPa, and which is buried under a bonding layer comprising silica and which is approximately 100 nm thick. The size of the unbonded area can be reduced still further when the bonding layer is less than approximately 100 nm thick.

Such direct bonding can also be accomplished when electrically conductive bonding pads, or contact pads, are present on the surfaces to be rigidly connected by direct bonding, where these pads are intended to form electrical interconnections between the two rigidly connected elements (substrates and/or electronic chips, for example).

Figure 2A:
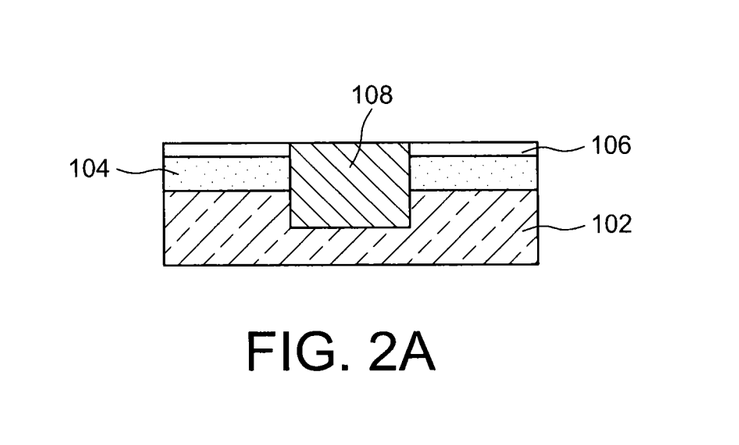
FIGS. 2A and 2B represent steps of a direct bonding method according to a second embodiment.
Figure 2B:
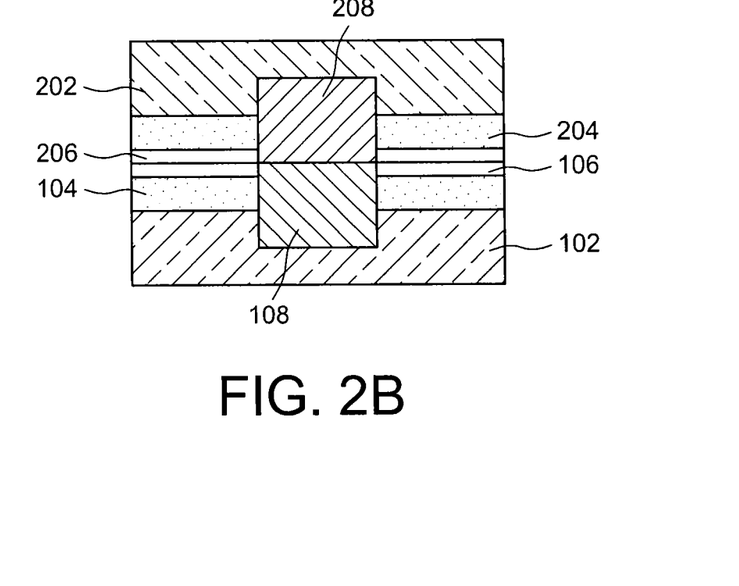

Thus, in the example of FIG. 2A, bonding pad 108, which in this case is metal, and for example made of copper, is produced through layers 104 and 106, and also in a portion of first element 102. Although not represented in FIG. 2A, a barrier layer, for example made of TiN and/or TaN, insulates pad 108 from layers 104 and 106 and also from first element 102. When first element 102 is rigidly connected to second element 202, bonding pad 108 is brought into direct contact with another bonding pad 208, for example of a similar nature to bonding pad 108, produced through layers 204 and 206 and also in a portion of second element 202 (see FIG. 2B). Given that porous layers 104, 204 are present, this direct bonding is insensitive to the particulate contamination present in the dielectric areas around bonding pads 108 and 208, i.e. to the particles present on the portions of bonding layers 106, 206 in contact with one another. Such direct bonding may be accomplished when bonding pads 108 and 208 comprise any material compatible with such direct bonding, such as for example copper and/or nickel. Although a single bonding pad 108, 208 is represented for each element 102, 202, several bonding pads may be produced in each of elements 102, 202. The particles present between pads 108 and 208 during bonding do not benefit from the presence of porous layers 104 and 204. Conversely, the bonding defects produced by these particles between metal pads 108, 208 may benefit the consolidation annealing which can enable these defects to be partially "repaired" when the metal interface is recrystallised.

Figure 3A:
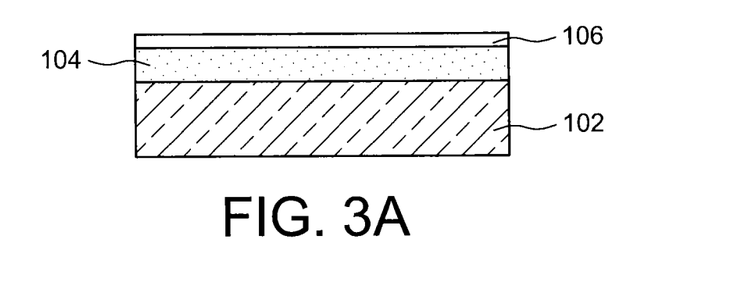
FIGS. 3A to 3C represents steps of production of a bonding pad in an element according to a first example embodiment.
Figure 3B:
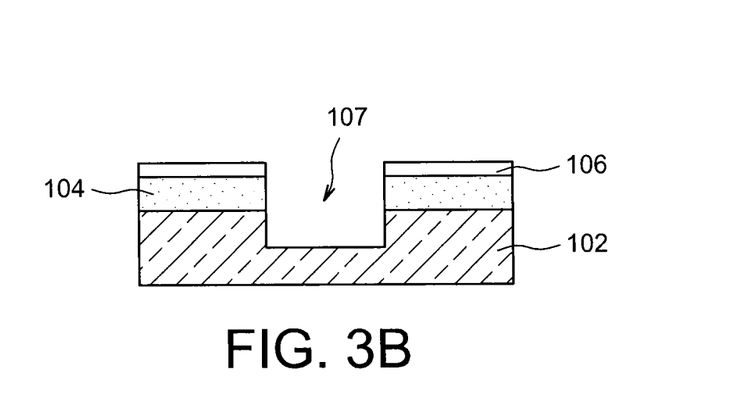
Figure 3C:
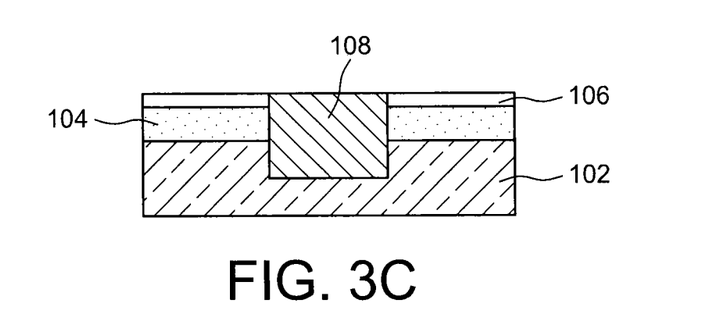

The bonding pads may be produced by the direct method known as the "damascene" method, as represented for example in FIGS. 3A to 3C. The locations of the bonding pad or pads are firstly formed by photolithography and etching in the stack of layers 104 and 106 and in first element 102, forming locations 107 of future bonding pads 108 (FIG. 3B). A layer of material able to form a diffusion barrier for the material of bonding pads 108 is deposited by covering the walls (back wall and side walls) of locations 107, and also bonding layer 106. This barrier layer is, for example, between approximately 10 nm and 50 nm thick. The material of bonding pads 108 (in this case copper) is then deposited on the barrier material, in particular filling locations 107. Any excess material of the barrier layer and of bonding pads 108 is then eliminated, for example by chemical mechanical polishing, stopping at bonding layer 106 (FIG. 3C). Bonding pad or pads 208 may be produced by using the same steps as those forming bonding pad or pads 108.

A second example embodiment of bonding pads 108 is represented in FIGS. 4A to 4G.

Figure 4A:
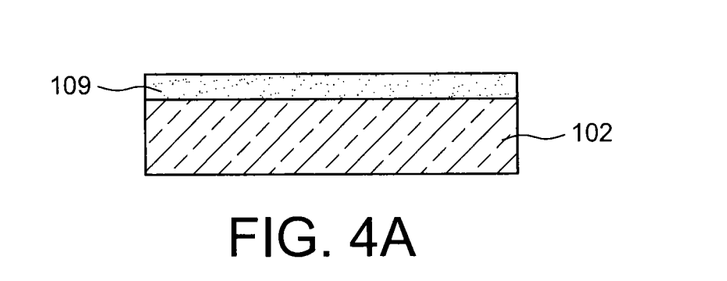
FIGS. 4A to 4G represents steps of production of a bonding pad in an element according to a second example embodiment.
Figure 4B:
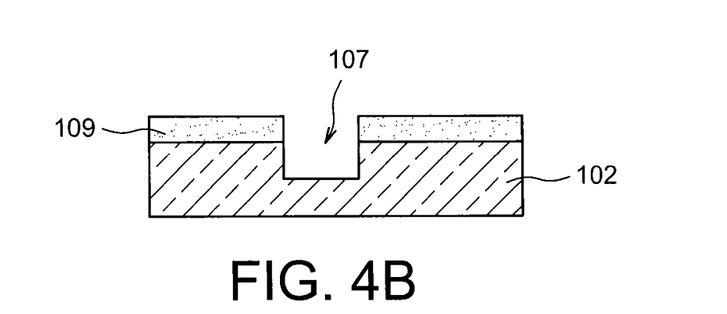
Figure 4C:
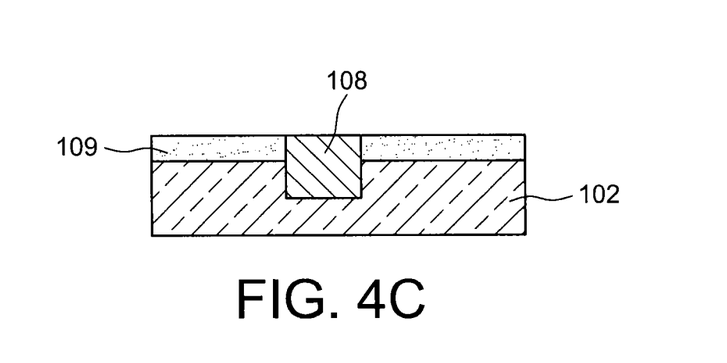
Figure 4D:
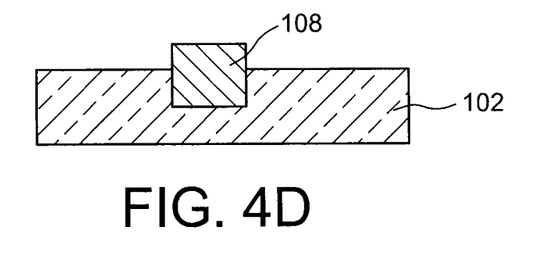
Figure 4E:
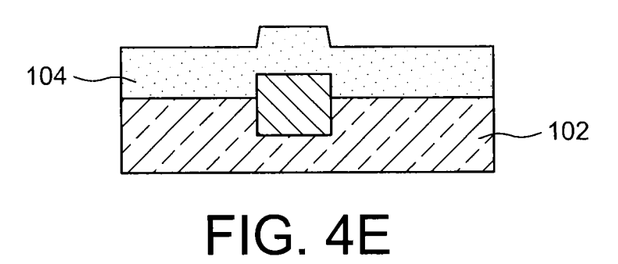
Figure 4F:
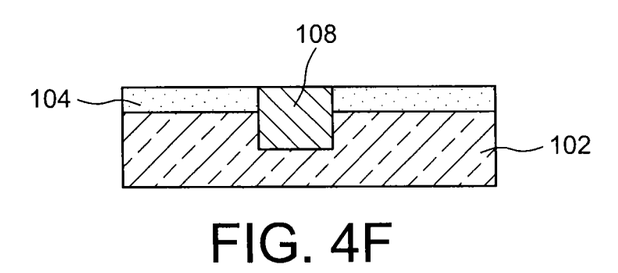
Figure 4G:
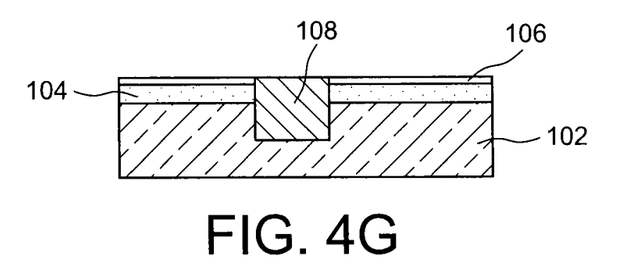

A layer of sacrificial material 109 is firstly deposited on first substrate 102 (FIG. 4A). Photolithography and etching of layer of sacrificial material 109 enable the future locations of the bonding pads in sacrificial material layer 109, which then forms an etching mask, to be defined. First element 102 is then etched according to the pattern of this etching mask, forming by this means locations 107 of bonding pads 108 (FIG. 4B). As represented in FIG. 4C, location or locations 107 are filled by electrically conductive material (possibly preceded by deposition of a barrier layer), forming by this means bonding pad or pads 108. Selective etching is then accomplished to eliminate sacrificial material layer 109 (FIG. 4D). First porous layer 104 is then deposited in conformal fashion (FIG. 4E), and this layer is then polished by CMP, stopping at bonding pad 108 (FIG. 4F). Finally, first bonding layer 106 is produced, by transforming, for example by means of a plasma treatment, an upper portion of first porous layer 104 (FIG. 4G). Bonding pad 208 may be produced in a manner comparable to the one described above in connection with FIGS. 4A to 4G, or alternatively in the manner described in connection with FIGS. 3A to 3C.

The invention claimed is:

1. A method for direct bonding between a first element and a second element, including at least the following steps:
    deposition of at least one first porous layer on at least one face of the first element, where the first porous layer is compressible and in which the deposition of the at least one first porous layer includes at least use of a PECVD deposition of porous SiOCH,
    production of at least one first bonding layer on the first porous layer, and
    rigid connection by direct bonding of the second element with the first bonding layer.

2. The method according to claim 1, in which the first porous layer has a void volume ratio greater than or equal to approximately 10% and/or includes at least one elastically deformable material having a Young modulus of less than or equal to approximately 20 GPa, and/or at least one plastically deformable material having an elastic limit of less than or equal to approximately 350 MPa.

3. The method according to claim 1, in which the size of the pores of the first porous layer is less than or equal to approximately one tenth the thickness of the first porous layer, and/or is less than the size of the particles likely to be present at the bonding interface between the two elements when a rigid connection by direct bonding is made.

4. The method according to claim 1, in which the first element and/or the second element includes a substrate or an electronic chip.

5. The method according to claim 1, also including the following steps:
   production, on at least one face of the second element, of at least one second compressible porous layer,
   production of at least one second bonding layer on the second porous layer,
   and in which a rigid connection by direct bonding of the second element with the first bonding layer is obtained by bringing the first bonding layer directly into contact with the second bonding layer.

6. The method according to claim 5, in which the second porous layer has a void volume ratio greater than or equal to approximately 10% and/or includes at least one elastically deformable material having a Young modulus of less than or equal to approximately 20 GPa, and/or at least one plastically deformable material having an elastic limit of less than or equal to approximately 350 MPa.

7. The method according to claim 1, in which the first porous layer is thicker than the first bonding layer.

8. The method according to claim 5, in which the second porous layer is thicker than the second bonding layer.

9. The method according to claim 5, in which the production of the second porous layer includes at least use of a PECVD deposition of porous SiOCH.

10. The method according to claim 1, in which the deposition of the first porous layer includes a deposition of a material able to be etched and intended to form the first porous layer, followed by formation of pores by chemical etching in the deposited material.

11. The method according to claim 5, in which the production of the second porous layer includes a deposition of a material able to be etched and intended to form the second porous layer, followed by formation of pores by chemical etching in the deposited material.

12. The method according to claim 1, in which the deposition of the first porous layer includes at least use of the following steps:
   deposition of a material of the first porous layer, where pore-forming particles are added to the said deposited material, and
   elimination of the said pore-forming particles, forming pores within the material of the first porous layer.

13. The method according to claim 5, in which the production of the second porous layer includes at least use of the following steps:
   deposition of a material of the second porous layer, where pore-forming particles are added to the said deposited material, and
   elimination of the said pore-forming particles, forming pores within the material of the second porous layer.

14. The method according to claim 12, in which the material of the first porous layer includes SiOCH.

15. The method according to claim 13, in which the material of the second porous layer includes SiOCH.

16. The method according to claim 1, in which production of the first bonding layer includes a step of deposition of a material of the first bonding layer on the first porous layer.

17. The method according to claim 5, in which production of the second bonding layer includes a step of deposition of a material of the second bonding layer on the second porous layer.

18. The method according to claim 1, in which production of the first bonding layer includes a step of thermal, plasma or chemical treatment of a portion of the first porous layer, where the said treated portion of the first porous layer forms the first bonding layer.

19. The method according to claim 5, in which production of the second bonding layer includes a step of thermal, plasma or chemical treatment of a portion of the second porous layer, where the said treated portion of the second porous layer forms the second bonding layer.

20. The method according to claim 1, also including, between the step of production of the first bonding layer and the step of rigid connection by direct bonding of the second element with the first bonding layer, implementation of the following steps:
   photolithography and etching of at least one bonding pad location through the first bonding layer, the first porous layer and a portion of the first element,
   deposition, at least in the said location, of at least one electrically conductive material forming the bonding pad,
   chemical mechanical planarisation, stopping at the first bonding layer,
   and in which, when the second element is rigidly connected by direct bonding with the first bonding layer, the bonding pad produced in the first element is rigidly connected by direct bonding with a bonding pad produced in the second element.

21. The method according to claim 1, also including, before the step of production of the first bonding layer, implementation of the following steps:
   photolithography and etching, through a portion of the first element, of at least one bonding pad location,
   deposition, at least in the said location, of at least one electrically conductive material forming the bonding pad,
   in which production of the first porous layer includes implementation of the following steps:
   deposition of the first porous layer on the first element and the bonding pad,
   chemical mechanical planarisation of the first porous layer, stopping at the bonding pad,
   and in which, when the second element is rigidly connected by direct bonding with the first bonding layer, the bonding pad produced in the first element is rigidly connected by direct bonding with a bonding pad produced in the second element.

22. The method according to claim 20, also including, prior to the deposition of the electrically conductive material in the said location, deposition of at least one layer of material forming a barrier to diffusion of the material of the bonding pad, where the electrically conductive material is subsequently deposited on this layer of barrier material.

23. The method according to claim 21, also including, prior to the deposition of the electrically conductive material in the said location, deposition of at least one layer of material forming a barrier to diffusion of the material of the bonding pad, where the electrically conductive material is subsequently deposited on this layer of barrier material.

24. A method for direct bonding between a first element and a second element, including at least the following steps:
   deposition of at least one first porous layer on at least one face of the first element, where the first porous layer is compressible, including
      deposition of a material of the first porous layer, wherein the material of the first porous layer includes SiOCH,
      addition of pore-forming particles to the deposited material, and
      elimination of the pore-forming particles, forming pores within the material of the first porous layer;
   production of at least one bonding layer on the first porous layer; and
   rigid connection by direct bonding of the second element with the first bonding layer.

* * * * *